United States Patent

Schanbacher

[11] 4,233,563
[45] Nov. 11, 1980

[54] FREQUENCY SELECTIVE HYSTERESIS COMPARATOR

[76] Inventor: William A. Schanbacher, 347 S. Glasgow, Inglewood, Calif. 90301

[21] Appl. No.: 940,072

[22] Filed: Sep. 6, 1978

[51] Int. Cl.³ .......................... H03K 9/06; H03K 9/08; H03K 5/08
[52] U.S. Cl. .................... 328/138; 328/111; 328/149; 307/290; 307/268
[58] Field of Search ............... 328/127, 205, 206, 265, 328/138, 146, 147, 165, 111, 149; 307/290; 325/429; 343/225

[56] References Cited

U.S. PATENT DOCUMENTS

| | | | |
|---|---|---|---|
| 3,109,944 | 11/1963 | Seestrom | 307/290 X |
| 3,119,070 | 1/1964 | Seliger | 328/127 X |
| 3,264,496 | 8/1966 | Scholl | 328/138 X |
| 3,380,003 | 4/1968 | Bemmann | 307/290 X |
| 3,566,284 | 2/1971 | Thelen | 328/138 X |
| 3,600,607 | 8/1971 | Vatin | 307/290 X |
| 3,781,692 | 12/1973 | Escoffier | 328/138 |

*Primary Examiner*—John S. Heyman
*Attorney, Agent, or Firm*—Don B. Finkelstein

[57] ABSTRACT

A wave shaping electrical circuit for a hysteresis comparator having enhanced low frequency noise immunity. A passive element differentiating network is between the signal source and the input circuit of the comparator. The circuit includes components to provide a time constant in the passive element differentiating network such that the corner frequency is greater than the frequency of a low frequency noise signal which may be included as a component of the input signal.

5 Claims, 2 Drawing Figures

FREQUENCY SELECTIVE HYSTERESIS COMPARATOR

BACKGROUND OF THE INVENTION

1. Field of the Invention

The present invention relates to an electrical circuit for wave shaping and, more particularly, it pertains to a hysteresis comparator having enhanced low frequency noise immunity.

2. Description of the Prior Art

Schmidt trigger circuits, or, equivalently, voltage-controlled bistable multivibrators, are known for their applicability as wave shaping circuits. A discussion of these circuits is given in Giacoletto, L. J., *Electronic Designers' Handbook*, 2d Ed., New York, McGraw-Hill Book Co., 1977, Sec. 18.72, Sec. 19, and Sec. 20.6. With sufficient regenerative feedback, the transfer function of these circuits is a hysteresis loop. In this case, the Schmidt trigger circuit is termed a hysteresis comparator. The hysteresis loop characteristic of such a comparator gives the circuit a high degree of noise immunity. However, when the noise and signal components of an input signal have approximately the same voltage excursions, adjusting the width of the input comparison region of a hysteresis comparator to eliminate noise increases the risk that information will be lost as well.

Hysteresis comparators have found application in command receivers which provide remote controlled actuation of mechanisms upon the receipt of a predetermined coded signal. These receivers are used in such applications as, for example, automatic garage door openers. An early version of such a command receiver is disclosed in U.S. Pat. No. 3,359,558, issued Dec. 19, 1967 to the inventor of the present invention.

Present day garage door opening systems typically use pulse-width-modulated coded signals at 250 bits per second for the actuation command. In a preferred embodiment of a command receiver the coded signal is detected, wave-shaped, and then decoded in digital decoding circuitry. The wave shaper serves to decrease the probability that the decoding circuitry will respond to noise and to increase the probability the decoder will respond to a valid signal. A hysteresis comparator used as the signal wave shaper for driving the decoder will block the transmission of all voltage excursions, and thus all noise, having a peak-to-peak amplitude less than the width of the hysteresis loop.

High sensitivity is desirable in a command receiver for increasing the range at which the remotely controlled actuator can respond to a transmitter. Stated alternatively, command receivers are typically designed to have high sensitivity so that the transmitters used in the system need have only relatively low-level radiation output. The high sensitivity is typically achieved through the use of a self-quenching superregenerative detector as the first stage in the receiver. This type of detector has a relatively very high gain.

A problem which arises in typical relatively low-cost production models of command receivers is due to the amplification in the detector of the 60 hertz (power frequency) hum produced by the power supply in the receiver.

The hum input to the wave shaper can have an amplitude which is approximately equal to the amplitude at the detected pulse-width modulated signal. Thus, a design for a hysteresis comparator having an input comparison region (i.e., the region defined by the difference between the two switching levels of the hysteresis loop) sufficiently wide to exclude the 60 hertz hum may also tend to exclude a coded signal to which a response is desired.

Thus, there is a need to include means in a command receiver to reduce the effect of power supply hum. With the effect of power supply hum reduced, switching levels of a hysteresis comparator in the receiver can be set for more reliable error-free response to transmitted signals at greater transmitter ranges.

SUMMARY OF THE INVENTION

The present invention is a hysteresis comparator made frequency selective by interposing a passive element differentiating network between the source of a signal and an input circuit for the comparator. The differentiating network may be the type of circuit frequently referred to as a highpass filter.

A capacitor is connected in series between a driver stage for the comparator and an input circuit of a differential amplifier included in the comparator. The capacitor, the output resistance and a driver stage for the comparator and the input resistance at the differential amplifier input circuit constitute the passive element differentiating network. The capacitance of the capacitor and the resistence values for the resistors are selected to provide a time constant for the network such that the break frequency, or corner frequency, of the network is greater than the frequency of a low-frequency noise signal included as a component of the input signal. The noise signal is thereby attenuated relative to a higher frequency pulse train signal included as another component of the input signal. A hysteresis comparator according to the invention is useful in such applications as wave shapers in command receivers for remotely controlled mechanical actuators. The low-frequency noise signal may be, for example, a power supply hum at 60 hertz while the repetition rate for the pulses in the pulse train signal may be, for example, 250 bits per second.

The input comparison region of the hysteresis loop characteristic of the comparator is selected to have a width sufficient to exclude the transmission of the low frequency noise at the noise amplitudes which are expected to be present at the comparator input circuit.

The frequency selectivity provided by the passive element differentiating network attenuates the lower frequency noise more than it attenuates the higher frequencies of the coded signal. This permits the input comparison region of the comparator circuit to be made narrower than would otherwise be desirable. A hysteresis comparator in accordance with the invention can therefore be made more sensitive in that it can be permitted to respond to lower levels of pulse train input signals.

DESCRIPTION OF THE PREFERRED EMBODIMENT

Figure 1:
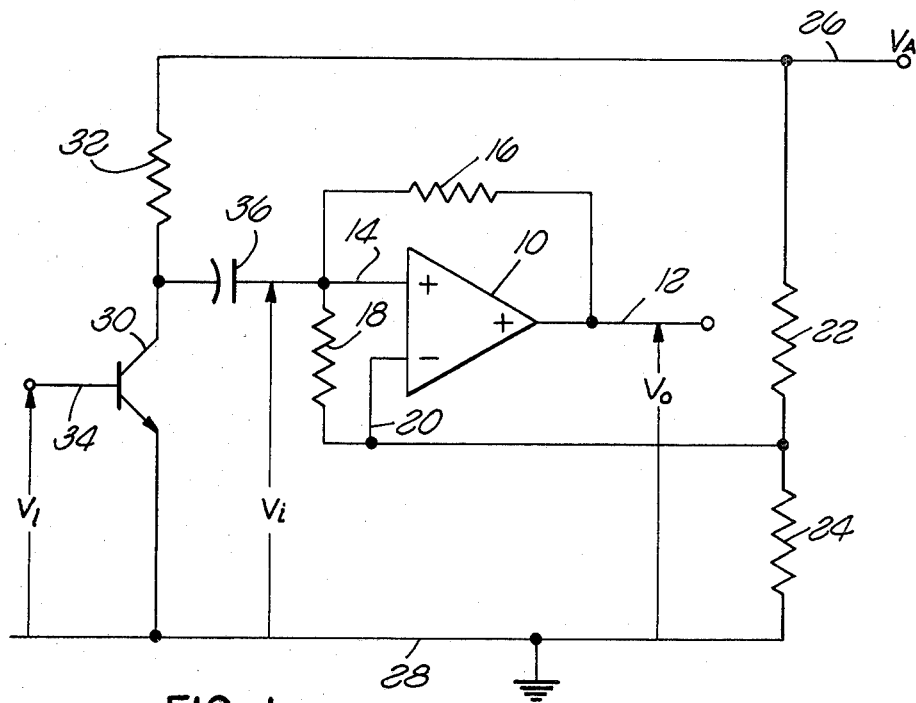
FIG. 1 is a schematic circuit diagram of a frequency selective hysteresis comparator in accordance with the invention.

Referring now to FIG. 1, there is shown a high-gain differential amplifier 10 with sufficient regenerative feedback coupled from its output circuit 12 to its noninverting input circuit 14 to cause it to function as a Schmidt trigger circuit having a hysteresis loop transfer function. Such a circuit is a hysteresis comparator. The regenerative feedback coupling is accomplished through a resistor 16. The differential amplifier 10 is preferably a type VA741 integrated circuit. The feed back resistor 16 preferably has a relatively high resistance. In the preferred embodiment, the resistance of resistor 16 is 4.7 megohms.

An input resistor 18 is coupled between the noninverting input circuit 14 and an inverting input circuit 20 of the differential amplifier 10. Input resistor 18 has a low resistance value relative to feedback resistor 16. In the preferred embodiment, the resistance of resistor 18 is 180 kilo-ohms.

Resistors 22 and 24 are connected in series between a dc power supply bus 26 for the circuit to FIG. 1 and a ground bus 28. The dc power supply has an output voltage, $V_A$, which is 10 volts dc in the preferred embodiment. The junction between the resistors 22 and 24 is connected to the inverting input circuit 20 of the high-gain differential amplifier 10. This connection provides a first dc bias voltage to inverting input circuit 20 and, through the input resistor 18, a second dc bias voltage to noninverting input circuit 14. The resistances for the voltage divider resistors 22 and 24 are preferably selected to be substantially equal to each other and at a low resistance relative to the input resistor 18. In the preferred embodiment, the resistances of each of the resistors 22 and 24 is 10 kilo-ohms.

The resistances of resistors 22 and 24 are selected to be equal to each other in order to set the dc bias voltage on inverting input circuit 20 at about one-half the dc supply voltage $V_A$. This sets the dc bias at both inverting input circuit 20 and noninverting input circuit 14 of differential amplifier 10 at a value which is about half way between the high and low output levels for $V_O$, the output voltage appearing on output circuit 12. When the input voltage $V_i$ on the differential amplifier 10 is at one extreme, the amplifier's output stage is driven to cutoff. The output voltage $V_O$ will then be at or near the dc power supply voltage $V_A$. When the input voltage on the differential amplifier 10 is at the other extreme, the amplifier's output stage is driven to saturation. The output voltage $V_O$ will then be at or near ground level. Thus, it is seen that a dc bias for the input circuits 14 and 20 which is about half the power supply voltage is also half-way between the extreme excursions of the output voltage $V_O$.

The resistance of input resistor 18 is made low relative to the resistance of feedback resistor 16 and made high relative to the resistance of the parallel combination of voltage divider resistors 22 and 24 so that the input resistance seen at input circuit 14 is substantially equal to the resistance of the input resistor 18.

Figure 2:
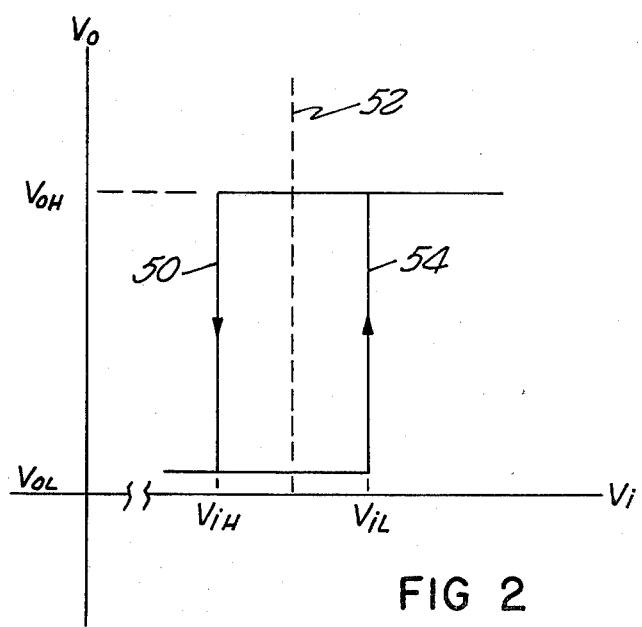
FIG. 2 is a graphical representation of the transfer function of the circuit represented in FIG. 1.

The relationship between the output voltage $V_O$ at the output circuit 12 and the input voltage $V_i$ at the input circuit 14 of the differential amplifier 10 is shown in FIG. 2. The graph of FIG. 2 is a hysteresis loop, a characteristic transfer function for Schmidt trigger circuits. The circuit functions as a hysteresis comparator for which input circuit 14 is the input circuit.

In the preferred embodiment, the voltage at inverting input circuit 20 is held constant at about 5 volts dc by the voltage divider circuit at resistors 22 and 24. When the output voltage is at its highest extreme, $V_oH$, or about 10 volts, the current flowing through the feedback resistor 16 from output circuit 12 to noninverting input circuit 14 of FIG. 1 is about one microampere (a five volt drop across about five megohms). This same current flows through the input resistor 18 from noninverting input circuit 14 to inverting input circuit 20 whereupon it will be seen that the potential at noninverting input circuit 14 is about 0.18 volts higher than the potential at inverting input circuit 20. A dynamically varying input voltage is required to reduce $V_i$ enough so that the potential at noninverting input circuit 14 is at least as low as the potential at inverting input circuit 20 in order to switch the Schmidt trigger circuit to its opposite state. The switching input voltage variation (0.18 volts in the preferred embodiment) required to produce this result is shown at $V_{iH}$ in FIG. 2. It is shown at the left side 50 of the hysteresis loop. The dc bias level from which the switching input voltage produces the variation is indicated by the vertical dashed line 52.

When the output voltage is at its lowest extreme, $V_{oL}$, or about ground potential, the current flowing through the feedback resistor 16 from noninverting input circuit 14 to the output circuit 12 of FIG. 1 is again about one microampere, but in the opposite direction. This current flows through the input resistor 18 from inverting input circuit 20 to non-inverting input circuit 14 whereupon it will be seen that the potential at noninverting input circuit 14 is about 0.18 volts lower than the potential at inverting input circuit 20. A dynamically varying input voltage is required to increase $V_i$ enough so that the potential at noninverting input circuit 14 is at least as high as the potential at inverting input circuit 20 in order to switch the Schmidt trigger circuit to its opposite state. The switching voltage variation (0.18 volts in the preferred embodiment) required to produce this result is labeled $V_{iL}$ in FIG. 2. It is shown at the right side 54 of the hysteresis loop. Again, the switching input voltage is a variation about the dc bias level represented by dashed line 52.

The region between the vertical sides 52 and 54, representing the switching input voltages, of the hysteresis loop in FIG. 2 is termed the input comparison region. From the above discussion it is apparent that the width of the input comparison region is $V_{iL}$ minus $V_{iH}$ volts. In the preferred embodiment, this region is about 0.36 volts wide.

Input signals having a peak-to-peak amplitude of 0.36 volts or less will not cause the circuit to switch. The hysteresis comparator is said to be immune to signals at those levels.

Referring once again to FIG. 1, a driver circuit for the hysteresis comparator is shown having a n-p-n transistor 30 connected as a common-emitter amplifier for applying a signal to the input circuit of the hysteresis comparator. In the preferred embodiment, a type 2N5210 transistor is used. A load resistor 32 in the collector circuit of the transistor 30 is connected to the dc power bus 26. In the preferred embodiment, the load resistor 32 has a resistance of 10 Kilo ohms which is much less than the resistance of the input resistor 18 at the input circuit 14 for the hysteresis comparator.

In a typical command receiver, the output voltage of the self-quenching superregenerative detector is applied as an input signal $V_1$ to the base 34 of transistor 30. This input signal typically has a noise component comprising 60 hertz power supply hum and a command signal component comprising a pulse-width modulated pulse train having a repetition rate of 250 bits per second.

The collector 30 of the driver circuit is connected to the input circuit 14 of the hysteresis comparator through a network employing passive reactance element 36. The passive reactance element 36 causes the network interposed between the driver circuit and the hysteresis comparator to be a passive element differentiating network of the type which is often termed a high-pass filter. In the preferred embodiment, the passive reactance element is a capacitor 36. In the preferred embodiment, the capacitance of the capacitor 36 is selected to be a value such that the time constant of the differentiating network has a break frequency, or corner frequency, greater than the frequency of the noise for which it is desired to make the comparator immune. Where the moise is 60 hertz power supply hum, the capacitance of the capacitor 36 is selected to be 0.01 microfarads. The resistive portion of the time constant is provided by the output resistance of the driver circuit in series with the input resistance of the hysteresis comparator.

In the preferred embodiment, this resistive portion of the time constant is given by the resistances of resistors 32 and 18, respectively, in series giving a total resistance of 190 kilo-ohms. The time-constant for the differentiating network is thus $1.9 \times 10-3$ seconds whereupon the transfer function of the differentiating network has a break frequency at 83.8 hertz. This differentiating network attenuates 60 hertz hum by 4.7 db relative to higher frequency signal components.

While the invention has been described in its preferred embodiments, it is understood that the words which have been used are words of description rather than of limitation and that changes within the purview of the appended claims may be made without departing from the true scope and spirit of the invention in its broadest aspects.

What is claimed is:

1. A circuit, comprising:
   (a) hysteresis comparator means for wave shaping a pulse train signal wherein the hystersis loop transfer function of said comparator means has an input comparison region of a selected width whereby any signal driving said comparator and having a peak-to-peak amplitude less than said selected width of said input comparison region is not transmitted by said comparator, wherein said hysteresis comparator means comprises:
      (1) a high gain differential amplifier having inverting input means, non-inverting input means, and output means;
      (2) positive feedback resistor means coupled between said output means and said non-inverting input means;
      (3) input resistor means coupled between said non-inverting input means and said inverting input means; and
      (4) voltage divider means for providing a bias voltage to said inverting input means;
   (b) means for applying an input signal to said comparator; and
   (c) a differentiating network connected between said means for applying an input signal to said comparator and an input circuit for said comparator, wherein said differentiating network comprises:
      (1) a capacitor coupled in series between said means for applying an input signal and said input circuit for said comparator, wherein said capacitor has a capacitance selected to cause said input circuit to function as a passive element differentiating network, wherein a relatively low frequency component of said input signal is attenuated relative to a pulse train signal component of said input signal, and wherein said pulse train signal component has a selected repetition rate at least as great as the frequency of said relatively low frequency component.

2. A circuit as recited in claim 1 wherein the resistance of said input resistor means is significantly less than the resistance of said positive feedback resistor means.

3. A circuit as recited in claim 2 wherein the resistance of said input resistor means is significantly greater than the resistance of said voltage divider means.

4. A circuit as recited in claim 3 wherein said bias voltage provided to said inverting input means is substantially equal to one-half the voltage of a dc power supply means for said circuit.

5. A circuit as recited in claim 4 wherein said selected repetition rate is 250 bits per second and wherein said relatively low frequency is 60 hertz.

* * * * *